United States Patent Office 3,325,379

Patented June 13, 1967

3,325,379

METHOD OF MAKING METALLIC PATTERNS HAVING CONTINUOUS INTERCONNECTIONS

Jacob J. Bussolini, West Babylon, Thomas P. Guida, Long Island City, and Gerald Stone, Syosset, N.Y., assignors to Hazeltine Research, Inc., a corporation of Illinois Filed May 22, 1962, Ser. No. 196,778
15 Claims. (Cl. 204—12)

*General*

Figure 1:
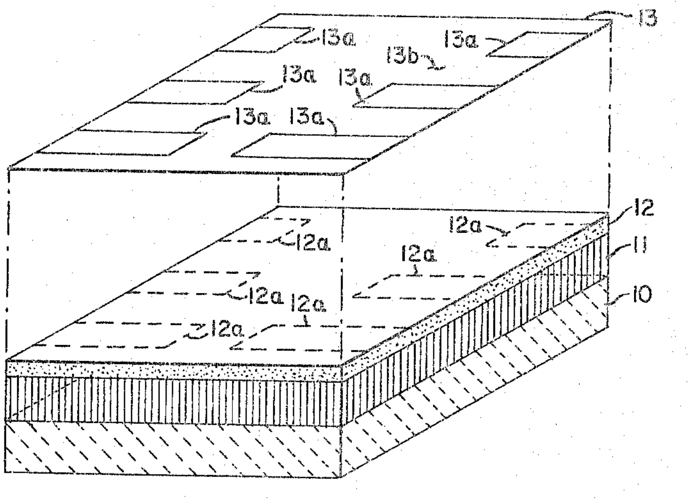

This invention relates to a method of making metallic patterns having continuous interconnections which is particularly useful in constructing electrical circuits and electrical components.

In the well-known printed circuit technique of making metallic patterns, wires which interconnect different printed circuits boards must be soldered or welded to the printed circuits. In any such operation, the reliability of the joint as an electrical conductor is dependent upon the reliability of the solder or weld connection. Very often the welding or soldering results in an imperfect joint.

If, however, the printed circuit conductor and the external interconnecting wire are one and the same with no joint having to be made, no reduction in circuit reliability results due to the possibility of a poor connection. The present invention is directed to a method of making such interconnections.

In addition, the present invention may be practiced to advantage in the construction of electrical circuits using dot components. Dot components are presently the ultimate in microminiature components from the standpoint of size. Dot components take the form of cylinders having an average physical size in the order of $\frac{1}{16}''$ in diameter and approximately the same dimension in thickness. The construction of this component does not permit the use of conventional methods such as soldering for making connections into a circuit. The method to be described hereinafter overcomes this limitation.

It is an object of the present invention to provide a new and useful method of making metallic patterns having continuous interconnections.

It is another object of the present invention to provide a method of making metallic patterns not subject to unreliable joints at interconnection points such as may be developed by soldering or welding.

It is a further object of the present invention to provide a method useful for fabricating electrical circuits employing dot components.

In accordance with the present invention a method of making metallic patterns having continuous interconnections comprises the steps of masking portions of a conductor-clad member and the step of placing a fixture adjacent to the conductor-clad member so that one surface of the fixture is in substantially the same plane as the conductor cladding. The method further includes the step of depositing on the aforesaid one surface of the fixture a conductive interconnection pattern having portions running to the edges of the fixture and meeting unmasked portions of the conductor cladding. The invention further includes the step of plating a metal to the unmasked portions of the conductor cladding and the conductive interconnection pattern.

For a better understanding of the present invention, together with other and further objects thereof, reference is had to the following description, taken in connection with the accompanying drawings, and its scope will be pointed out in the appended claims.

Figure 4:
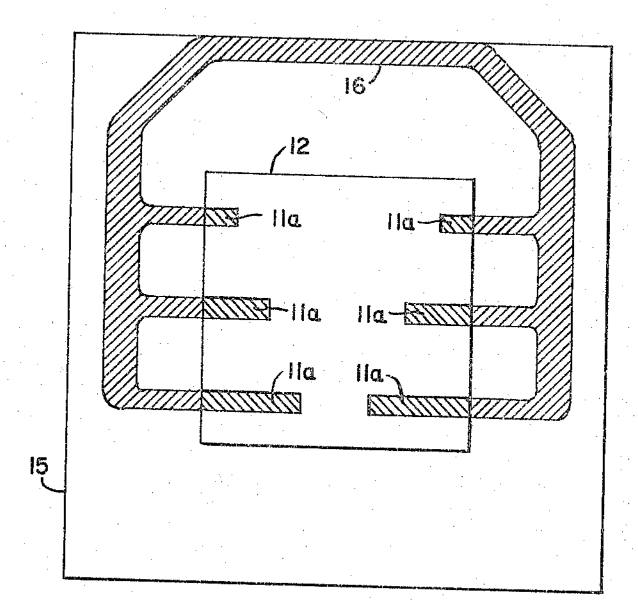
Figure 5:
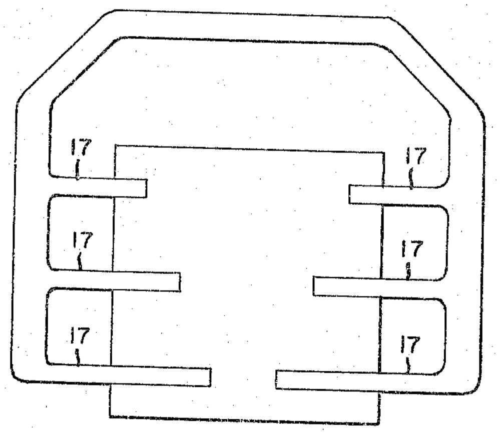
Figure 6:
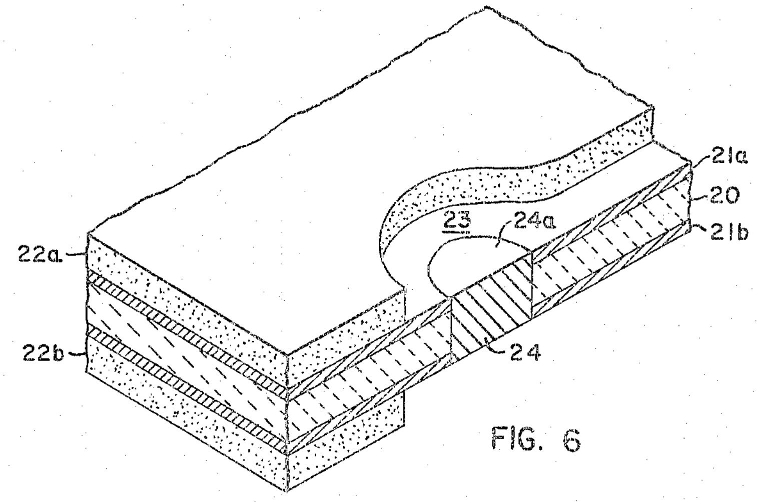
Figure 7:
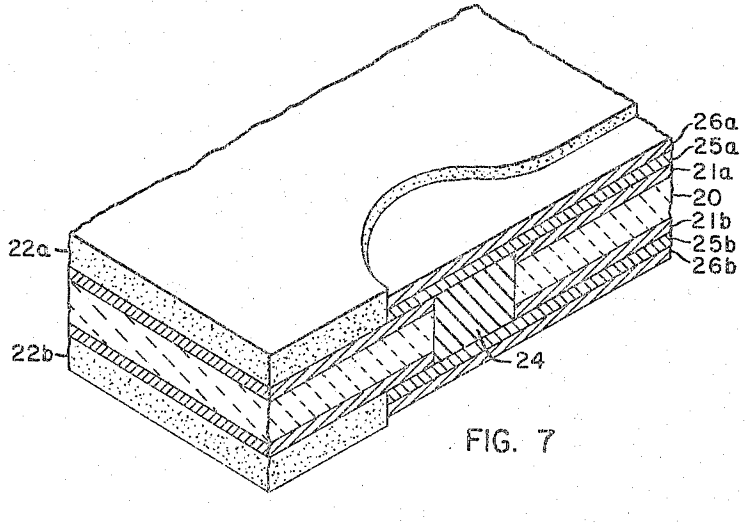
Figure 8:
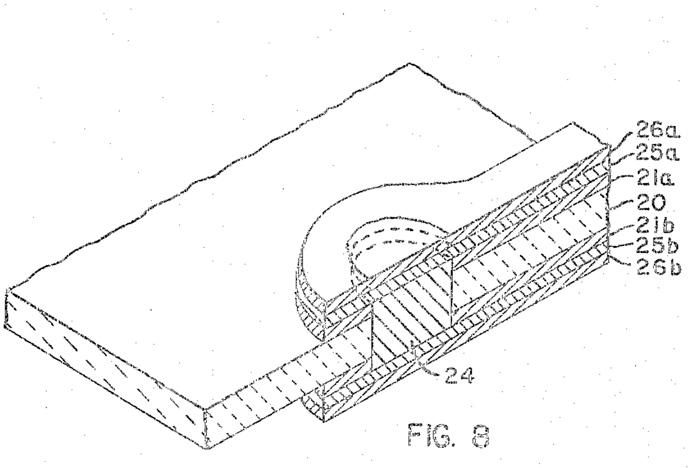

Referring to the drawings:

FIGS. 1–5, inclusive, show various steps of the present invention along with the product fabricated in accordance with the invention at various stages of its development, and FIGS. 6–8, inclusive, show how the present invention may be practiced for fabricating electrical circuits using dot components.

*Description of the invention*

Figure 2:
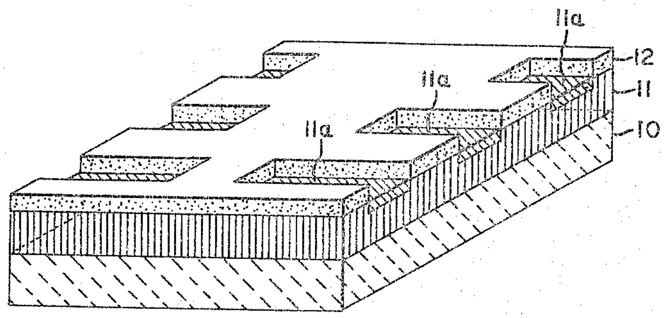

The first step in the method of making metallic patterns having continuous interconnections in accordance with the present invention is that of masking portions of a conductor-clad member. This conductor-clad member may be made as follows. Referring to FIGS. 1 and 2, a transparent conductor composed of stannic chloride, antimony trichloride and acetone is deposited on a substrate 10 (represented by the dashed cross-hatching) of any appropriate material such as glass, metal or ceramic. This may be done by first heating the substrate 10 to a high temperature, for example, 630° C. and then spraying the heated substrate with the transparent conductor in liquid solution. The spraying is continued until a layer 11 (represented by the vertical cross-hatching) of desired thickness is built up. It is understood that the dimensions in all the figures are exaggerated for the purpose of clarity of illustration. The coated substrate is then allowed to cool to room temperature whereupon the process of depositing the transparent conductor on the substrate 10 is completed. This method of depositing the transparent conductor on the substrate is explained in more detail in U.S. Patent No. 2,921,257—Boicey, issued Jan. 12, 1960.

The masking of portions of the conductor-clad member may be accomplished by employing any of the well-known techniques used in fabricating printed circuits. Specifically, the conductor-clad member may be coated with the usual photoresist material 12 (represented by the dotted cross-section). Next, instead of the usual photographic negative, a photographic positive 13 of a desired electrical wiring plan or pattern is applied to the photoresist coating 12. By a photographic positive it is meant that opaque portions 13*a* (shown clear) of the positive correspond to the desired pattern, while transparent portions 13*b* correspond to unwanted areas. The photographic positive 13 is shown removed from the photoresist coating 12 merely for clarity of illustration. In actual operation, the photographic positive is placed flush over the photoresist coating 12. As light is applied to the photoresist coating 12 through the photographic positive 13, specific portions of the photoresist coating corresponding to the unwanted areas are exposed, while those portions 12*a* (shown dashed) corresponding to the desired wiring plan remain unexposed. Those portions of the photoresist coating which are exposed become hardened after the development process, while the unexposed portions 12*a* of the photoresist coating are washed away during the development process. The hardened portions of the photoresist coating 12 which are retained after the development process act as a mask for portions of the transparent conductor 11 as will be brought out hereinafter, while those portions of the transparent conductor previously lying beneath unexpected portions of the photoresist coating are uncovered and lay open. The spaces previously occupied by the unexposed photoresist coating 12 are shown in FIG. 2 by the cutouts in the photoresist coating.

Next, the uncovered portions of the transparent conductor 11 are partially reduced so that reduced metallized areas are developed while a layer of the original transparent conductor is retained beneath these metallized areas. The reduced areas are shown by the diagonal cross-hatching 11*a* on the bottom surfaces of the cutouts in FIG. 2 and the diagonal cross-hatching, as distinguished from the vertical cross-hatching, on the edge of layer 11.

One method by which these portions of the transparent conductor can be partially reduced is described in detail in Thomas P. Guida's copending application Ser. No. 42,682, filed July 13, 1960, now abandoned, and entitled "Conductive Films and Method of Producing Same." Briefly, the substrate 10 with the transparent conductor 11 and exposed photoresist coating 12 is immersed in a solution of pure water and a small amount of zinc powder. The exact amount of zinc powder actually used is not critical. Then hydrochloric acid is added in very small amounts, for example, with an eye-dropper until bubbles are observed on the conductor areas and they turn opaque. The exact strength of the solution is dependent upon the desired thickness of the reduced metallized areas 11*a*. Next, the substrate with its coating, is removed from the solution and is washed with any suitable neutralizing solution. This substrate having portions of the transparent conductor partially reduced and other portions covered with an exposed photoresist coating is the masked conductor-clad member referred to above. It should be pointed out that instead of reducing only the uncovered portions of the transparent conductor after exposure and development of the photoresist coating, the entire transparent conductor may be partially reduced prior to coating its surface with the photoresist material.

The adhesion of the treated conductor to the substrate 10 is not impaired by the treatment just described. Furthermore, it has been found that unlike the poor adhesion of plated metal to the untreated transparent conductor 11, plated metals adhere tightly to the treated conductor or more particularly to the reduced metallized areas 11*a*.

Figure 3:
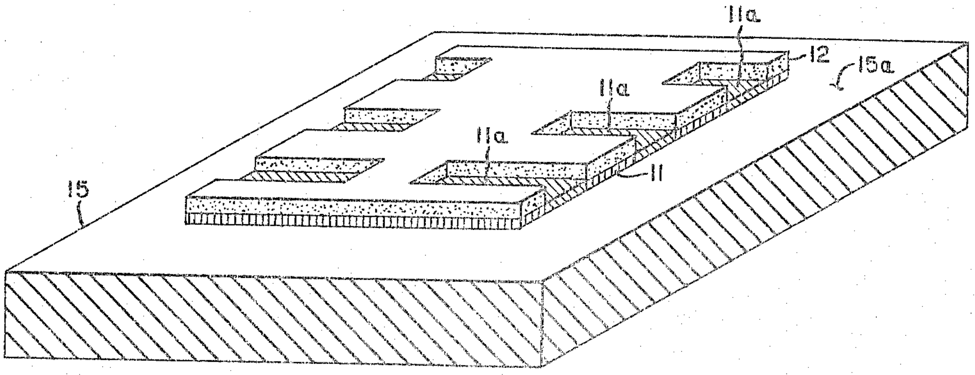

The second step in the method of making metallic patterns having continuous interconnections in accordance with the present invention is that of placing a fixture adjacent to the conductor-clad member so that one surface of the fixture is in substantially the same plane as the conductor cladding. Referring to FIG. 3, the masked conductor-clad member may be inserted into a holding fixture 15. As shown in this figure, the holding fixture 15 has a cutout corresponding to the contour of the conductor-clad member. The composition of the holding fixture 15 is such that a metal painted or plated to it may be peeled away. The significance of this point will be brought out in more detail hereinafter. It is sufficient at this time to specify that the holding fixture 15, or at least its top surface, should be composed of a material such as silicone rubber having elastomeric properties; this means that painted or plated metals may be peeled away from it. The conductor-clad member is inserted into the holding fixture 15 so that one surface of the holding fixture, namely, top surface 15*a*, is in substantially the same plane as the reduced metallized areas 11*a*. Furthermore, it is desirable to have the planar dimensions of the cutout in the holding fixture 15 exactly equal to the planar dimensions of the conductor-clad member so that the side edges of the conductor-clad member are flush against the edges of the cutout.

The next step in the method of making metallic patterns having continuous interconnections is that of depositing on the top surface 15*a* of the holding fixture 15, a conductive interconnection pattern having portions running to the edges of the fixture and meeting unmasked portions of the conductor cladding. This interconnection pattern may be deposited by stenciling or silk screening a conductive paint or epoxy onto surface 15*a*. Referring to FIG. 4, the unmasked portions 11*a* of the conductor cladding are shown by the diagonal cross-hatching running from the upper left to the lower right, while the conductive interconnection pattern 16 is shown by the diagonal cross-hatching running from the upper right to the lower left. As shown in FIG. 4, various portions of the interconnection pattern 16 run to the edges of the cutout in the holding fixture 15 and meet the unmasked portions 11*a* of the conductor cladding. The conductive pattern is deposited so that it bridges the gaps between the edges of the cutout in the holding fixture 15 and the corresponding edges of the conductor-clad member. It is also pointed out that the interconnection pattern is continuous and is terminated at a point at the top edge of the holding fixture 15. The purpose of this feature will be brought out hereinafter.

The next step in the method of making metallic patterns having continuous interconnections is that of plating a metal, such as copper, to the unmasked portions of the conductor cladding and the conductive interconnection pattern. This plating step may be performed by using conventional electro-plating techniques. Specifically, this metal is plated over the reduced metallized areas 11*a* and over the conductive interconnection pattern 16. During the plating process, the reduced metallized areas 11*a*, corresponding to the desired pattern, and the conductive interconnection pattern 16 receive the plating simultaneously. The result is a smooth, single, continuous plated pattern. Since a layer of the transparent conductor 11 still exists beneath all the reduced areas 11*a*, the transparent conductor, the reduced metallized areas and the continuous interconnection pattern 16 serve as a common electrode during the electro-plating process. Thus, the interconnection pattern 16 is terminated at a single common point to facilitate the electro-plating process. As previously mentioned, those portions of the photoresist coating 12 which are exposed and developed become hardened. This exposed photoresist material physically prevents the plating of the copper onto the transparent conductor or anything else lying beneath it. On the other hand, the reduced metallized areas 11*a*, having no such protective shield, receive the copper plating.

After the step of electro-plating, the exposed photoresist coating 12 and those portions of the transparent conductor 11 lying beneath the exposed photoresist coating are removed. This step may be performed by light sand blasting.

Finally, the substrate, with its various coatings, is removed from the cutout in the holding fixture 15 and the interconnection pattern 16 is peeled away from the top surface 15*a* of the holding fixture. It is now clear that in order to facilitate this step of peeling the interconnection pattern 16 away from the top surface 15*a* of the holding fixture 15, at least the top surface of the holding fixture should have elastomeric properties. The single unitary piece composed of the substrate and its interconnection pattern is shown in FIG. 5. Next, the ribbon sections 17 of the interconnection pattern may be trimmed to any desired length.

It is apparent from the foregoing that two substrates placed side by side may be fabricated to have continuous interconnections between them.

While the major advantage of the present invention is the elimination of unreliable joints, another apparent advantage of the interconnections made in accordance with the present invention is a uniform thickess all along the various portions of the pattern and the interconnection ribbons. Furthermore, since the thickness of the interconnection ribbons may be controlled by the amount of plating, ribbons of any desired flexibility may be developed.

*Use of the invention with dot components*

FIGS. 6–8, inclusive, show how the present invention may be practiced in making electrical circuits using dot components. The method to be described in this connection is essentially the same as the method just described. The following description will, however, include the use of different materials for the various component parts of the electrical circuits. This is in no way intended to limit the method previously described and the method to be described to the materials used in the respective descriptions. Rather, it is pointed out that the various materials may be used in either method interchangeably.

Referring to FIGS. 6 and 7, the conductor-clad member is composed of a substrate 20 and two layers of metal cladding 21a and 21b. This metal-clad substrate may be the ordinary commercially available printed circuit board having an epoxy glass laminate covered by a layer of copper on each of its two major surfaces.

The first step in the application of the present invention to the fabrication of electrical circuits using dot components is that of masking portions of the conductor-clad member. Again, this masking may be accomplished by employing the same photographic techniques previously described. The result again is that those portions of the copper claddings 21a and 21b corresponding to unwanted areas of the metallic pattern or electrical wiring plan are protected by layers of exposed photoresist material 22a and 22b while those portions of the copper cladding corresponding to the desired pattern lay open and uncovered.

Next, holes for the dot components are drilled or punched in appropriate positions on the desired electrical wiring plan. One such hole is shown in FIG. 6 in that area of the electrical wiring plan represented by the reference numeral 23.

The next step is that of filling the holes with an elastomeric material 24 (represented by the heavy cross-hatching). This elastomeric material is similar to the holding fixture 15 shown in FIGS. 3 and 4 and serves the same purpose. The elastomeric material may be silastic rubber in its uncured form or rubber plugs specifically molded for the holes. It is desirable to have the mating edges of the conductor-clad member and the rubber plug flush against each other so that the gap therebetween is a minimum. Furthermore, the top surface 24a of the rubber plug 24 is in substantially the same plane as the upper copper layer 21a and the bottom surface (not shown) of the rubber plug 24 is in substantially the same plane as the lower copper layer 21b.

After the hole is filled with the rubber plug 24, a conductive paint is deposited on the top and bottom surfaces of the rubber plug. With respect to the conductive paint deposited on the bottom surface of the rubber plug 24, the paint is laid down so that it bridges the gap between the mating edges of the rubber plug and the conductor-clad member and, in fact, overlaps a small portion of the conductor cladding 21b. This provides electrical continuity. As to the top surface 24a, the conductive paint is applied so that it terminates, for the most part, at the edge of the rubber plug. However, to provide electrical continuity, the conductive paint is laid to bridge the gap between the mating edges of the rubber plug 24 and the conductor cladding 21a over a small portion of the gap.

The next step is that of plating a metal, such as copper, to the unmasked portions of the conductor cladding and the conductive paint deposited on the elastomeric material. Here too, this plating step may be performed by applying conventional electro-plating techniques. As shown in FIG. 7, copper layers 25a and 25b are plated over all portions of the desired electrical wiring plan and the conductive paint on the top and bottom surfaces of the rubber plug 24. Again, during the plating process all areas receive the plating simultaneously thus resulting in a smooth, single, continuous pattern. The copper lying beneath the exposed portions of the photoresist material 22a and 22b is protected and does not receive the metal plating.

After the copper plating is completed, the entire member is solder plated. This solder plating is represented by the layers 26a and 26b in FIG. 7. Next, the entire member is placed in a chemical etching solution similar to the solutions used in conventional printed circuit techniques. The exposed photoresist coatings 22a and 22b and the copper layers lying beneath them are thus removed. The solder platings 26a and 26b serves as an etch resist for those portions of the copper plating lying beneath it. The only metals remaining on the substrate after etching are the three layers of metal which correspond to the desired electrical wiring plan, namely, a portion of the original copper layers 21a and 21b, the plated copper layers 25a and 25b and the plated solder layers 26a and 26b. This is shown in FIG. 8.

Next, those portions of the plated copper and the plated solder lying above the top surface 24a of the rubber plug 24 are carefully peeled back so that the rubber plug may be removed from the hole. The dot component may now be inserted in the hole after an application of epoxy solder to both its ends. The previously peeled away portions of the two layers of plated metal are now replaced. The layers of plated metal above and below the dot component are then firmly pressed together and held by some mechanical means until the epoxy solder has cured. The dot component is now held firmly in place with the desired electrical contacts at its terminals.

As an alternate method of inserting the dot components, each dot component itself may be directly inserted into the hole rather than using rubber plugs. The various stages of plating may then be applied directly to the terminals of the dot component. However, care must be taken to ensure that no damage to the dot component results due to the plating process.

While there have been described what are at present considered to be the preferred embodiments of this invention, it will be obvious to those skilled in the art that various changes and modifications may be made therein without departing from the invention and it is, therefore, aimed to cover all such changes and modifications as fall within the true spirit and scope of the invention.

What is claimed is:

1. A method of making metallic patterns having continuous interconnections comprising:
   - the step of masking portions of a conductor-clad member;
   - the step of placing a fixture adjacent to said conductor-clad member so that one surface of said fixture is in substantially the same plane as said conductor cladding;
   - the step of depositing on said one surface of said fixture a conductive interconnection pattern having portions running to at least one edge of said fixture and meeting unmasked portions of said conductor cladding;
   - and the step of plating a metal to said unmasked portions of said conductor cladding and said conductive interconnection pattern to produce a continuous plated interconnection therebetween.

2. A method of making metallic patterns having continuous interconnections comprising:
   - the step of masking portions of a conductor-clad member;
   - the step of placing an elastomeric fixture adjacent to said conductor-clad member so that one surface of said fixture is in substantially the same plane as said conductor cladding;
   - the step of depositing on said one surface of said elastomeric fixture a conductive interconnection pattern having portions running to the at least one edge of said fixture and meeting unmasked portions of said conductor cladding;
   - and the step of plating a metal to said unmasked portions of said conductor cladding and said conductive interconnection pattern to produce a continuous plated interconnection therebetween.

3. A method of making metallic patterns having continuous interconnections comprising:
   - the step of masking portions of a conductor-clad member;
   - the step of placing an elastomeric fixture adjacent to said conductor-clad member so that one surface of said fixture is in substantially the same plane as said conductor cladding;
   - the step of depositing on said one surface of said elastomeric fixture a conductive interconnection pattern having portions running to at least one edge of said fixture and meeting unmasked portions of said conductor cladding;

the step of plating a metal to said unmasked portions of said conductor cladding and said conductive interconnection pattern to produce a continuous plated interconnection therebetween;

and the step of peeling that portion of said metal plating corresponding to said interconnection pattern away from said elastomeric fixture.

4. A method of making metallic patterns having continuous interconnections comprising:

the step of coating a conductor-clad member with a photoresist material;

the step of exposing portions of said photoresist coating and removing the unexposed photoresist material;

the step of placing an elastomeric fixture adjacent to said conductor-clad member so that one surface of said fixture is in substantially the same plane as said conductor cladding;

the step of depositing on said one surface of said elastomeric fixture a conductive interconnection pattern having portions running to at least one edge of said fixture and meeting portions of said conductor cladding previously lying beneath unexposed portions of said photoresist coating;

the step of plating a metal to said portions of said conductor cladding previously lying beneath unexposed portions of said photoresist coating and to said conductive interconnection pattern to produce a continuous plated interconnection therebetween;

and the step of peeling that portion of said metal plating corresponding to said interconnection pattern away from said elastomeric fixture.

5. A method of making metallic patterns having continuous interconnections comprising:

the step of depositing a transparent conductor onto a surface of a substrate;

the step of masking portions of said transparent conductor;

the step of placing an elastomeric fixture adjacent to said conductor-coated substrate so that one surface of said fixture is in substantially the same plane as said transparent conductor;

the step of depositing on said one surface of said elastomeric fixture a conductive interconnection pattern having portions running to at least one edge of said fixture and meeting unmasked portions of said transparent conductor;

and the step of plating a metal to said unmasked portions of said transparent conductor and said conductive interconnection pattern to produce a continuous plated interconnection therebetween.

6. A method of making metallic patterns having continuous interconnections comprising:

the step of depositing a transparent conductor onto a surface of a substrate;

the step of masking portions of said transparent conductor;

the step of partially reducing the unmasked portions of said transparent conductor to develop reduced metallized areas;

the step of placing an elastomeric fixture adjacent to said conductor-coated substrate so that one surface of said fixture is in substantially the same plane as said reduced metallized areas;

the step of depositing on said one surface of said elastomeric fixture a conductive interconnection pattern having portions running to at least one edge of said fixture and meeting said reduced metallized areas to produce a continuous plated interconnection therebetween;

the step of plating a metal to said reduced metallized areas and said conductive interconnection pattern;

and the step of peeling that portion of said metal plating corresponding to said interconnection pattern away from said elastomeric fixture.

7. A method of making metallic patterns having continuous interconnections comprising:

the step of spraying a transparent conductor onto a surface of a substrate;

the step of coating said transparent conductor with a photoresist material;

the step of exposing portions of said photoresist coating and removing the unexposed photoresist material;

the step of partially reducing those portions of said transparent conductor previously lying beneath unexposed portions of said photoresist coating to develop reduced metallized areas;

the step of placing an elastomeric fixture adjacent to said conductor-clad substrate so that one surface of said fixture is in substantially the same plane as said reduced metallized areas;

the step of depositing on said one surface of said elastomeric fixture a conductive interconnection pattern having portions running to at least one edge of said fixture and meeting said reduced metallized areas;

the step of plating a metal to said reduced metallized areas and said conductive interconnection pattern to produce a continuous plated interconnection therebetween;

and the step of peeling that portion of said metal plating corresponding to said interconnection pattern away from said elastomeric fixture.

8. A method of making metallic patterns having continuous interconnections comprising:

the step of spraying a transparent conductor onto a surface of a substrate raised to an elevated temperature;

the step of cooling said substrate to room temperature;

the step of coating said transparent conductor with a photoresist material;

the step of applying a photographic positive of a desired electrical wiring plan to said surface coated with said photoresist material;

the step of applying light to said photoresist coating through said photographic positive to leave unexposed portions of said photoresist coating corresponding to said desired electrical wiring plan and to expose the remaining portions of said photoresist coating;

the step of removing the unexposed photoresist material;

the step of partially reducing those portions of said transparent conductor previously lying beneath unexposed portions of said photoresist coating to develop reduced metallized areas;

the step of placing an elastomeric fixture adjacent to said conductor-clad substrate so that one surface of said fixture is in substantially the same plane as said reduced metallized areas;

the step of depositing on said one surface of said elastomeric fixture a conductive interconnection pattern having portions running to at least one edge of said fixture and meeting said reduced metallized areas;

the step of plating a metal to said reduced metallized areas and said conductive interconnection pattern to produce a continuous plated interconnection therebetween;

and the step of peeling that portion of said metal plating corresponding to said interconnection pattern away from said elastomeric fixture.

9. A metallic pattern having continuous interconnections made in accordance with the method described in claim 1.

10. A method of making electrical circuits composed of dot components comprising:

the step of masking portions of a conductor-clad member;

the step of drilling holes through said conductor-clad member at prescribed positions on unmasked portions of said conductor cladding;

the step of placing an elastomeric material in said holes so that one surface of said material is in substantially the same plane as said conductor cladding;

the step of depositing on said one surface of said elastomeric material, a conductive layer having portions running to the edges of said material and meeting unmasked portions of said conductor cladding;

the step of plating a metal to said unmasked portions of said conductor cladding and said conductive layer;

and the step of peeling said metal plating over said conductive layer away from said elastomeric material.

11. A method of making electrical circuits composed of dot components comprising:

the step of masking portions of each of first and second metal layers separated by a substrate;

the step of drilling holes completely through said two metal layers and said substrate at prescribed positions on unmasked portions of said metal layers;

the step of placing an elastomeric material in said holes so that one surface of said material is in substantially the same plane as said first metal layer and another surface of said material is in substantially the same plane as said second metal layer;

the step of depositing on one of said surfaces of said elastomeric material a first conductive layer having portions running to the edges of said material and meeting unmasked portions of said first metal layer;

the step of depositing on the other of said surfaces of said elastomeric material a second conductive layer having portions running to the edges of said material, meeting unmasked portions of said second metal layer and bridging the gap between said elastomeric material and said second metal layer;

the step of plating a metal to said unmasked portions of said metal layers and said conductive layers;

the step of peeling said metal plating over said first conductive layer away from said elastomeric material;

and the step of removing said elastomeric material from said hole.

12. A method of making electrical circuits composed of dot components comprising:

the step of masking portions of each of first and second metal layers separated by a substrate;

the step of drilling holes completely through said two metal layers and said substrate at prescribed positions on unmasked portions of said metal layers;

the step of placing an elastomeric material in said holes so that one surface of said material is in substantially the same plane as said first metal layer and another surface of said material is in substantially the same plane as said second metal layer;

the step of depositing on one of said surfaces of said elastomeric material a first conductive layer having portions running to the edges of said material and meeting unmasked portions of said first metal layer;

the step of depositing on the other of said surfaces of said elastomeric material a second conductive layer having portions running to the edges of said material, meeting unmasked portions of said second metal layer and bridging the gap between said elastomeric material and said second metal layer;

the step of plating a metal to said unmasked portions of said metal layers and said conductive layers;

the step of peeling said metal plating over said first conductive layer away from said elastomeric material;

the step of removing said elastomeric material from said hole;

and the step of inserting dot components in said hole after said elastomeric material has been removed from said hole.

13. An electrical circuit made in accordance with the method described in claim 10.

14. A method of making metallic patterns having continuous interconnections comprising:

the step of masking portions of a conductor-clad member;

the step of placing a substrate adjacent to said conductor-clad member so that the section of said substrate to be interconnected is in substantially the same plane as said conductor cladding;

the step of depositing on said section of said substrate, a conductive interconnection pattern having a portion running to an edge of said substrate and meeting an unmasked portion of said conductor cladding;

and the step of plating a metal to said unmasked portion of said conductor cladding and said conductive interconnection pattern to produce a continuous plated interconnection therebetween.

15. A method of making metallic patterns having continuous interconnections comprising:

the step of depositing a transparent conductor onto a surface of a first substrate;

the step of masking portions of said transparent conductor;

the step of placing a second substrate adjacent said conductor-coated first substrate so that one surface of said second substrate is in substantially the same plane as said transparent conductor;

the step of depositing on said one surface of said second substrate a conductive interconnection pattern having portions running to at least one edge of said second substrate and meeting unmasked portions of said transparent conductor;

and the step of plating a metal to said unmasked portions of said transparent conductor and said conductive interconnection pattern to produce a continuous plated interconnection therebetween.

References Cited

UNITED STATES PATENTS

| | | | |
|---|---|---|---|
| 2,641,439 | 6/1953 | Williams | 204—3 |
| 3,006,819 | 10/1961 | Wilson et al. | 204—15 |
| 3,019,482 | 2/1962 | Van Houten | 18—5.3 |
| 3,098,951 | 7/1963 | Ayer et al. | 29—155.5 |
| 3,143,484 | 8/1964 | Olin et al. | 204—15 |
| 3,176,191 | 3/1965 | Rowe | 317—101 |

FOREIGN PATENTS

| | | |
|---|---|---|
| 775,267 | 5/1957 | Great Britain. |

JOHN H. MACK, *Primary Examiner.*

JOHN F. CAMPBELL, *Examiner.*

C. I. SHERMAN, *Assistant Examiner.*